(12) United States Patent
Kim

(10) Patent No.: US 12,167,532 B2
(45) Date of Patent: Dec. 10, 2024

(54) INSULATION STRUCTURES AND PRINTED CIRCUIT BOARD INCLUDING THE SAME

(71) Applicant: SAMSUNG ELECTRONICS CO., LTD., Suwon-si (KR)

(72) Inventor: Hyejin Kim, Suwon-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 867 days.

(21) Appl. No.: 17/223,430

(22) Filed: Apr. 6, 2021

(65) Prior Publication Data

US 2022/0078907 A1   Mar. 10, 2022

(30) Foreign Application Priority Data

Sep. 7, 2020   (KR) .................. 10-2020-0113842

(51) Int. Cl.
| | |
|---|---|
| H05K 1/03 | (2006.01) |
| B32B 27/08 | (2006.01) |
| B32B 27/20 | (2006.01) |
| B32B 27/38 | (2006.01) |
| H05K 1/02 | (2006.01) |
| H05K 1/11 | (2006.01) |

(52) U.S. Cl.
CPC ............. *H05K 1/036* (2013.01); *B32B 27/08* (2013.01); *B32B 27/20* (2013.01); *B32B 27/38* (2013.01); *H05K 1/0298* (2013.01); *H05K 1/0373* (2013.01); *H05K 1/115* (2013.01); *B32B 2307/206* (2013.01); *B32B 2307/538* (2013.01); *B32B 2457/08* (2013.01)

(58) Field of Classification Search
CPC .... H05K 1/024; H05K 1/0298; H05K 1/0373; H05K 1/036; H05K 2201/0209; B32B 27/20; B32B 2457/08; B32B 2307/538; B32B 2264/302; B32B 2264/301; B32B 2250/24; B32B 2250/03; B32B 2264/10
See application file for complete search history.

(56) References Cited

U.S. PATENT DOCUMENTS

| | | |
|---|---|---|
| 7,992,296 B2 | 8/2011 | Kim et al. |
| 9,120,293 B2 | 9/2015 | Yokota et al. |

(Continued)

FOREIGN PATENT DOCUMENTS

| | | |
|---|---|---|
| JP | 2006-165400 | 6/2006 |
| JP | 2006-210689 | 8/2006 |

(Continued)

*Primary Examiner* — William H. Mayo, III
*Assistant Examiner* — Rhadames Alonzo Miller
(74) *Attorney, Agent, or Firm* — Muir Patent Law, PLLC

(57) ABSTRACT

An insulation structure includes: a first resin layer including first fillers; a second resin layer on the first resin layer and including second fillers; and a third resin layer on the second resin layer and including third fillers. A diameter of each of the first fillers may be more than about 200 nm and equal to or less than about 500 nm. A diameter of each of the second fillers may be more than about 10 nm and equal to or less than about 200 nm. A diameter of each of the third fillers may be equal to or less than about 10 nm. An arithmetic average roughness (Ra) and a ten point average roughness (Rz) of a surface of the insulation structure may be equal to or less than about 30 nm and equal to or less than about 100 nm, respectively.

20 Claims, 8 Drawing Sheets

(56) References Cited

U.S. PATENT DOCUMENTS

| | | | |
|---|---|---|---|
| 2011/0287243 A1 | 11/2011 | Carney et al. | |
| 2012/0301825 A1* | 11/2012 | Yoshida | G03F 7/095 430/270.1 |
| 2013/0149514 A1* | 6/2013 | Hayashi | H01L 23/145 428/323 |
| 2014/0116764 A1* | 5/2014 | Inoue | H05K 1/036 428/339 |
| 2014/0118976 A1* | 5/2014 | Yoshikawa | H01L 23/5384 361/761 |
| 2014/0166347 A1 | 6/2014 | Kim et al. | |
| 2020/0154568 A1* | 5/2020 | Na | H05K 3/0011 |
| 2022/0375842 A1* | 11/2022 | Sakaguchi | H01L 23/49816 |

FOREIGN PATENT DOCUMENTS

| | | |
|---|---|---|
| JP | 5016401 | 6/2012 |
| JP | 6133689 | 4/2017 |
| KR | 10-1070798 B1 | 10/2011 |
| KR | 20130115022 | 10/2013 |

\* cited by examiner (a)

(b)

INSULATION STRUCTURES AND PRINTED CIRCUIT BOARD INCLUDING THE SAME

CROSS-REFERENCE TO RELATED APPLICATION

This application claims priority under 35 USC § 119 to Korean Patent Application No. 10-2020-0113842, filed on Sep. 7, 2020, in the Korean Intellectual Property Office, and entitled: "Insulation Structures and Printed Circuit Board Including the Same," which is incorporated by reference herein in its entirety.

BACKGROUND

1. Field

Embodiments relate to an insulation structure and a printed circuit board (PCB) including the same.

2. Description of the Related Art

As a miniaturization of a PCB is increased to obtain high performance of a semiconductor device, fine circuit patterns may be formed on a PCB.

SUMMARY

Embodiments are directed to an insulation structure, including: a first resin layer including first fillers; a second resin layer on the first resin layer and including second fillers; and a third resin layer on the second resin layer and including third fillers. A diameter of each of the first fillers may be more than about 200 nm and equal to or less than about 500 nm. A diameter of each of the second fillers may be more than about 10 nm and equal to or less than about 200 nm. A diameter of each of the third fillers may be equal to or less than about 10 nm. An arithmetic average roughness (Ra) and a ten point average roughness (Rz) of a surface of the insulation structure may be equal to or less than about 30 nm and equal to or less than about 100 nm, respectively.

Embodiments are also directed to an insulation structure, including: first to third resin layers sequentially stacked, the first to third resin layers including first to third fillers, respectively. The first filler may have a greater diameter than the second filler, and the second filler may have a greater diameter than the third filler. The first resin layer may have a greater thickness than the second resin layer, and the second resin layer may have a greater thickness than the third resin layer. The diameter of the third filler may be equal to or less than about 5% of the diameter of the first filler. An arithmetic average roughness (Ra) and a ten point average roughness (Rz) of a surface of the third resin layer may be equal to or less than about 30 nm and equal to or less than about 100 nm or less, respectively.

Embodiments are also directed to a printed circuit board (PCB), including: a core; a first circuit pattern on the core; a first insulation structure on the core and covering the first circuit pattern; and a second circuit pattern on the first insulation structure. The first insulation structure may include: a first resin layer including first fillers; a second resin layer on the first resin layer and including second fillers; and a third resin layer on the second resin layer and including third fillers. A diameter of each of the first fillers may be more than about 200 nm and equal to or less than about 500 nm, a diameter of each of the second fillers may be more than about 10 nm and equal to or less than about 200 nm, and a diameter of each of the third fillers may be equal to or less than about 10 nm. An arithmetic average roughness (Ra) and a ten point average roughness (Rz) of a surface of the first insulation structure may be equal to or less than about 30 nm and equal to or less than about 100 nm, respectively.

BRIEF DESCRIPTION OF THE DRAWINGS

Features will become apparent to those of skill in the art by describing in detail example embodiments with reference to the attached drawings in which.

DETAILED DESCRIPTION

Figure 1:
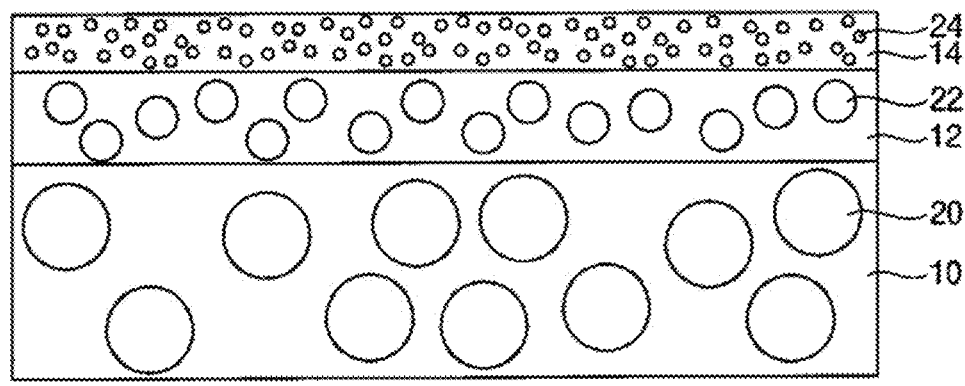
FIGS. 1 and 2 are cross-sectional views illustrating an insulation structure in accordance with example embodiments.
Figure 2:
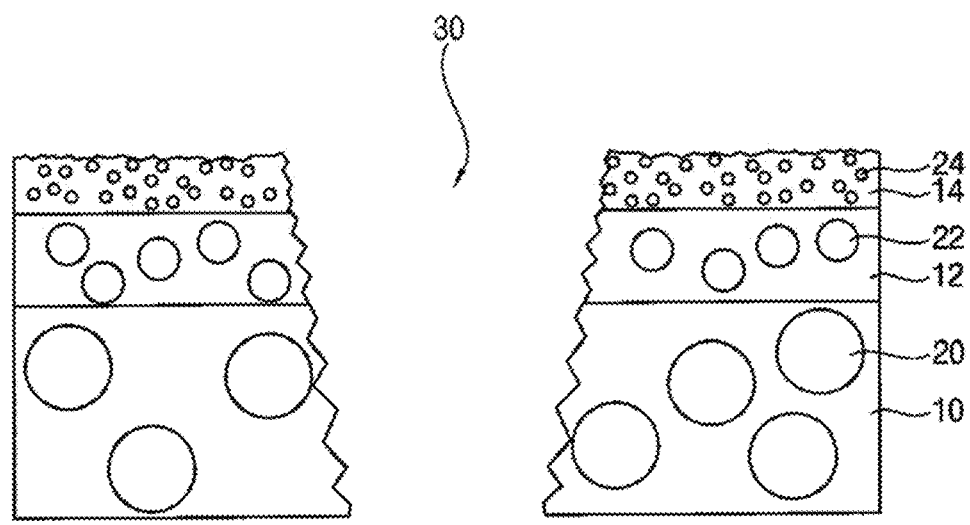

FIGS. 1 and 2 are cross-sectional views illustrating an insulation structure in accordance with example embodiments.

Referring to FIG. 1, the insulation structure may include a first resin layer 10, a second resin layer 12 on the first resin layer 10, and a third resin layer 14 on the second resin layer 12.

In example embodiments, each of the first to third resin layers 10, 12, and 14 may include an epoxy resin. The epoxy resin may be formed from components that include molecules containing one or more epoxy groups, e.g., molecules containing two or more epoxy groups, e.g., molecules containing three or more epoxy groups.

In example embodiments, the epoxy resin may include, e.g., a bisphenol A epoxy resin, a bisphenol F epoxy resin, a bisphenol S epoxy resin, a phenol novolac epoxy resin, a cresol novolac epoxy resin, an alkylphenol novolac epoxy resin, a biphenyl epoxy resin, an aralkyl epoxy resin, a dicyclopentadiene epoxy resin, a naphthalene-based epoxy resin, a naphthol epoxy resin, an epoxy resin of a condensate of phenols and aromatic aldehyde having a phenolic hydroxyl group, a biphenylaralkyl epoxy resin, a fluorene epoxy resin, a xanthene epoxy resin, a triglycidyl isocyanurate, a rubber-modified epoxy resin or a phosphorus-based epoxy resin. For example, the epoxy resin may include one or more of a bisphenol A epoxy resin, a phenol novolac epoxy resin, a cresol novolac epoxy resin, a naphthalene-based epoxy resin, or a rubber-modified epoxy resin or a phosphorus-based epoxy resin.

The first resin layer 10, the second resin layer 12, and the third resin layer 14 may include first fillers 20, second fillers 22, and third fillers 24, respectively.

In example embodiments, each of the first to third fillers 20, 22, and 24 may include an inorganic filler. The inorganic filler may lower a coefficient of thermal expansion (CTE) of the insulation structure.

A volume ratio of the inorganic filler to the insulation structure may be varied according to characteristics intended for the insulation structure. In example embodiments, each of a volume ratio of the first fillers 20 to the first resin layer 10, a volume ratio of the second fillers 22 to the second resin layer 12, and a volume ratio of the third fillers 24 to the third resin layer 14 may be in a range of about 40% to about 80%, e.g., about 40%. If the volume ratio is less than about 40%, a dielectric loss and the CTE of the insulation structure may be increased. If the volume ratio is greater than about 80%, an adhesion strength of the insulation structure to a copper foil may be lowered.

In example embodiments, the inorganic filler may include, e.g., silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, or calcium zirconate.

In example embodiments, each of the first to third fillers 20, 22, and 24 may be, e.g., spherical or elliptical. A diameter of each of the first fillers 20 may be greater than a diameter of each of the second fillers 22. The diameter of each of the second fillers 22 may be greater than a diameter of each of the third fillers 24.

In an example embodiment, the diameter of each of the first fillers 20 may be more than about 200 nm and equal to or less than about 500 nm, the diameter of each of the second fillers 22 may be more than about 10 nm and equal to or less than about 200 nm, and the diameter of each of the third fillers 24 may be greater than 0 nm and equal to or less than about 10 nm. In an example embodiment, the diameter of each of the third fillers 24 may be equal to or less than about 5% of the diameter of each of the first fillers 20.

The volume ratio of the first fillers 20 to the first resin layer 10, the volume ratio of the second fillers 22 to the second resin layer 12, and the volume ratio of the fillers 24 to the third resin layer 14 may be substantially the same as or similar to each other. However, the diameter of each of the first fillers 20 may be greater than the diameter of each of the second fillers 22, and the diameter of each of the second fillers 22 may be greater than the diameter of each of the third fillers 24. Thus, a thickness of the first resin layer 10 may be greater than a thickness of the second resin layer 12, and the thickness of the second resin layer 12 may be greater than a thickness of the third resin layer 14.

In an example embodiment, a total thickness of the first to third resin layers 10, 12, and 14 together may be about 15 μm to about 40 μm. If the total thickness is less than about 15 μm, a gap between circuit patterns may be narrow when the insulation structure is applied to a device, so that an electrical short may occur. If the total thickness is greater than about 40 μm, it may be difficult to reduce the integration degree of the device or miniaturize the device.

In an example embodiment, the thickness of the first resin layer 10 may be equal to or more than about 10 μm and equal to or less than about 25 μm, the thickness of the second resin layer 12 may be equal to or more than about 5 μm and less than about 10 μm, and the thickness of the third resin layer 14 may be less than about 5 μm.

Each of the first to third resin layers 10, 12, and 14 may further include a curing agent. The curing agent may cure the epoxy resin.

In an example embodiment, the curing agent may include, e.g., an amide-based curing agent, a polyamine-based curing agent, an acid anhydride curing agent, a phenol novolac curing agent, a polymercaptan curing agent, a tertiary amine curing agent, and an imidazole curing agent. The amide-based curing agent may include, e.g., dicyandiamide, the polyamine-based curing agent may include, e.g., diethylenetriamine, triethylenetetramine, N-aminoethylpiperazine, diaminodiphenylmethane, or adipic acid dihydrazide. The acid anhydride curing agent may include, e.g., pyromellitic anhydride, benzophenone tetracarboxylic anhydride, ethyleneglycol bistrimellitic anhydride, glycerol tris-trimellitic anhydride, or maleic methylcyclohexene tetracarboxylic anhydride. The polymercaptan curing agent may include, e.g., trioxanetrimesitylene mercaptan. The tertiary amine curing agent may include, e.g., benzyldimethylamine or 2,4,6-tris(dimethylaminomethyl) phenol. The imidazole curing agent may include, e.g., 2-ethyl-4-methyl imidazole, 2-methyl imidazole, 1-benzyl-2-methyl imidazole, 2-heptadecyl imidazole, 2-undecyl imidazole, 2-phenyl-4-methyl-5-hydroxymethyl imidazole, 2-phenyl imidazole, 2-phenyl-4-methyl imidazole, 1-benzyl-2-phenyl imidazole, 1,2-dimethyl imidazole, 1-cyanoethyl-2-phenyl imidazole, or 2-phenyl-4,5-dihydroxymethyl imidazole.

In example embodiments, a weight ratio of the curing agent to the insulation structure may be in a range of about 0.1% to about 1% in order not to deteriorate intrinsic properties of the epoxy resin.

Each of the first to third resin layers 10, 12, and 14 may further include a curing accelerator. The curing accelerator may efficiently cure the epoxy resin.

In example embodiments, the curing accelerator may include, e.g., a metal-based curing accelerator, an imidazole-based curing accelerator, or an amine-based curing accelerator.

In example embodiments, the metal-based curing accelerator may include, e.g., an organic metal complex or an organic metal salt. The organic metal complex may include, e.g., organic cobalt complexes such as cobalt (II) acetylacetonate, cobalt (III) acetylacetonate, and the like, organic copper complexes such as copper (II) acetylacetonate and the like, organic zinc complexes such as zinc (II) acetylacetonate and the like, organic iron complexes such as iron (III) acetylacetonate and the like, organic nickel complexes such as nickel (II) acetylacetonate and the like, or organic manganese complexes such as manganese (II) acetylacetonate and the like. The organic metal salt may include, e.g., zinc octylate, tin octylate, zinc naphthenate, cobalt naphthenate, tin stearate, or zinc stearate.

In example embodiments, the imidazole-based curing accelerator may include, e.g., 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidizolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, 2-phenyl-4-methyl-5-hydroxymethylimidazole, 2,3-dihydroxy-1H-pyrrolo [1,2-a]benzimidazole, 1-dodecyl-2-methyl-3-benzylimidazolium chloride, 2-methylimidazoline, or 2-phenylimidazoline.

In example embodiments, the amine-based curing accelerator may include, e.g., trialkylamines (trimethylamine, tributylamine and etc.), 4-dimethylaminopyridine, benzyldimethylamine, 2,4,6-tris(dimethylaminomethyl)phenol, or 1,8-diazabicyclo(5,4,0)-undecene.

Each of the first to third resin layers 10, 12, and 14 may further include a thermoplastic resin. The thermoplastic resin may improve film properties and mechanical properties of the insulation structure.

In example embodiments, the thermoplastic resin may include, e.g., a phenoxy resin, a polyimide resin, a polyamide-imide (PAI) resin, a polyether-imide (PEI) resin, a polysulfone (PS) resin, a polyether sulfone (PES) resin, a polyphenylene ether (PPE) resin, a polycarbonate (PC) resin, a polyether ether ketone (PEEK) resin, or a polyester resin.

In example embodiments, a weight average molecular weight of the thermoplastic resin may be about 5,000 to about 200,000. If the weight average molecular weight is less than about 5,000, the effect of improving film formability or mechanical strength may not be sufficient. If the weight average molecular weight is greater than about 200,000, compatibility with the epoxy resin may not be sufficient, a surface roughness may increase after curing, and the formation of a high-density fine pattern may be difficult.

Referring to FIG. 2, the insulation structure may be cured and applied to a printed circuit board (PCB). Inner sidewalls of the first to third resin layers 10, 12, and 14 may be roughened by a process for forming a through via hole 130 and a desmear process, and a surface of the third resin layer 14 may be roughened by the desmear process (see FIG. 6).

In example embodiments, an arithmetic average roughness (Ra) of the inner sidewall of the first resin layer 10 may be about 50 nm to about 70 nm, and a ten point average roughness (Rz) of the inner sidewall of the first resin layer 10 may be about 700 nm to about 900 nm. An Ra of the inner sidewall of the second resin layer 12 may be about 40 nm to about 50 nm, and an Rz of the inner sidewall of the second resin layer 12 may be about 500 nm to about 700 nm. An Ra of the inner sidewall and the surface of the third resin layer 14 may be about 30 nm or less, and an Rz of the inner sidewall and the surface of the third resin layer 14 may be about 100 nm or less.

Figure 14:
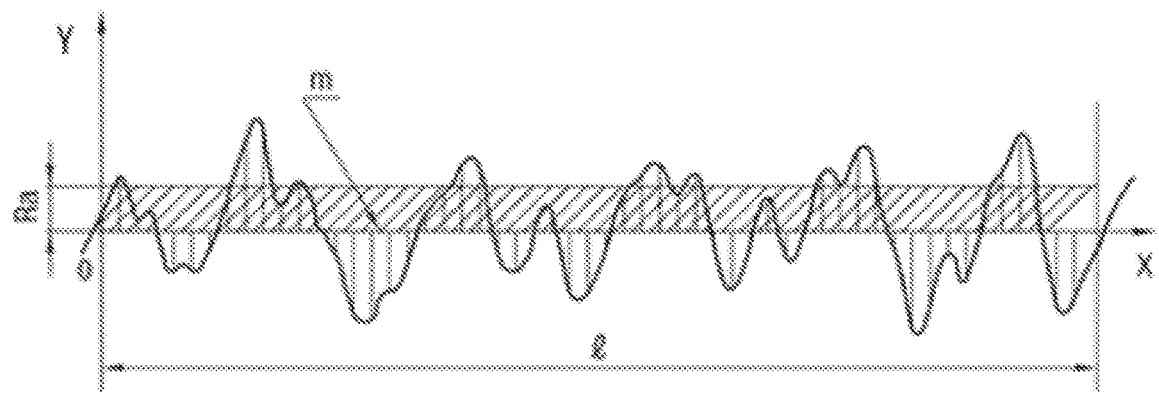
FIG. 14 illustrates roughness curves. Specifically, (a) in FIG. 15 is a roughness curve for arithmetic average roughness Ra, and (b) in FIG. 14 is a roughness curve for ten point average roughness Rz.
Figure 14:
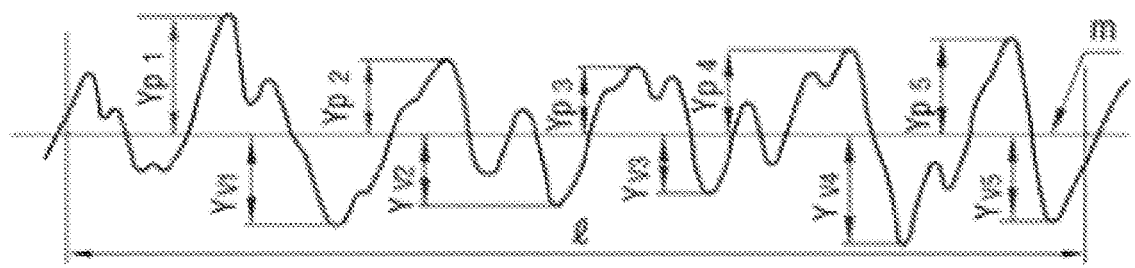

Referring to the roughness curve for arithmetic average roughness Ra illustrated in (a) of FIG. 14, the arithmetic average roughness Ra is a value obtained according to the following formula after extracting only a reference length (in a direction of an average line m from the following roughness curve, the following roughness curve being represented as y=f(x) with the direction of the average line m as an X-axis and a direction perpendicular to the X-axis as a Y-axis.

$$Ra = \frac{1}{\ell} \int_0^\ell |f(x)| dx$$

Referring to the roughness curve for ten point average roughness Rz illustrated in (b) of FIG. 14, the ten point average roughness Rz means a sum of an average value of absolute values of the highest to the fifth calculated elevation $Y_{P1}, Y_{P2}, Y_{P3}, Y_{P4},$ and $Y_{P5}$ measured from the average line m in a vertical direction and an average value of absolute values of the lowest to the fifth calculated elevation $Y_{V1}, Y_{V2}, Y_{V3}, Y_{V4},$ and $Y_{V5}$ measured from the average line m in the vertical direction after extracting only a reference length (in a direction of an average line m from the following roughness curve.

$$Rz = \frac{|Y_{p1} + Y_{p2} + Y_{p3} + Y_{p4} + Y_{p5}| + |Y_{v1} + Y_{v2} + Y_{v3} + Y_{v4} + Y_{v5}|}{5}$$

During the process for forming the through via hole 130 and the desmear process, some of the first fillers 20 having diameters of more than about 200 nm and equal to or less than about 500 nm may be separated from the first resin layer 10, and thus the Ra of the inner sidewall of the first resin layer 10 may be about 50 nm to about 70 nm, and the Rz of the inner sidewall of the first resin layer 10 may be about 700 nm to about 900 nm. Further, some of the second fillers 22 having diameters of more than about 10 nm and equal to or less than about 200 nm may be separated from the second resin layer 12, and thus the Ra of the inner sidewall of the second resin layer 12 may be about 40 nm to about 50 nm, and the Rz of the inner sidewall of the second resin layer 12 may be about 500 nm to about 700 nm. Further, some of the third fillers 24 having diameters of equal to or less than about 10 nm may be separated from the third resin layer 14, and thus the Ra of the inner sidewall of the third resin layer 14 may be equal to or less than about 30 nm, and the Rz of the inner sidewall of the third resin layer 14 may be equal to or less than about 100 nm.

The inner sidewalls of the first to third resin layers 10, 12, and 14 may have low Ra and Rz, and thus a uniform seed layer 140 having a high interfacial adhesion may be formed on the inner sidewalls of the first to third resin layers 10, 12, and 14. Further, fine first and second through vias 170 and 230 may be formed (see FIGS. 6 to 11).

Additionally, during the desmear process, some of the third fillers 24 having diameters of equal to or less than about 10 nm may be separated from the third resin layer 14, and thus the Ra of the surface of the third resin layer 14 may be equal to or less than about 30 nm, and the Rz of the surface of the third resin layer 14 may be equal to or less than about 100 nm.

The surface of the third resin layer 14 may have low Ra and Rz, and thus the uniform seed layer 140 having a high interfacial adhesion may be formed on the surface of the third resin layer 14. Accordingly, the seed layer 140 may also have Ra and Rz that are substantially the same as or similar to Ra and Rz of the surface of the third resin layer 14, and thus UV scattering from the seed layer 140 may be reduced to thereby form a fine photoresist pattern 150 during the subsequent exposure process, and further, fine first to fourth circuit patterns 115, 180, 215, and 240 may be formed (see FIGS. 6 to 11).

Referring to following Table 1, the insulation structure in accordance with an Example included the first resin layer 10 including the first fillers 20 having a diameter of about 500 nm, the second resin layer 12 including the second fillers 22 having a diameter of about 200 nm, and the third resin layer 14 including the third fillers 24 having a diameter of about 10 nm. Also, in the Example, a volume ratio of the first fillers 20 to the first resin layer 10, a volume ratio of the second fillers 22 to the second resin layer 12, and a volume ratio of the three fillers 24 to the third resin layer 14 were about 40%. Also, in the Example, Ra and Rz of the surface of the insulation structure were about 30 nm and about 100 nm, respectively.

An insulation structure in accordance with Comparative Example 1 included a resin including fillers having a diameter of about 500 nm. A volume ratio of the fillers to the resin was about 40%. Ra and Rz of the surface of the insulation structure were about 70 nm and about 900 nm, respectively.

An insulation structure in accordance with Comparative Example 2 included a resin including fillers having a diameter of about 200 nm. A volume ratio of the fillers to the resin was about 40%. Ra and Rz of the surface of the insulation structure were about 50 nm and about 70 nm, respectively.

An insulation structure in accordance with Comparative Example 3 included a resin including fillers having a diameter of about 10 nm. A volume ratio of the fillers to the resin was about 40%. Ra and Rz of the surface of the insulation structure were about 30 nm and about 100 nm, respectively.

In Table 1, after curing the insulation structures of the Example and Comparative Examples 1 to 3, values obtained by measuring a CTE, a glass transition temperature (Tg), an elastic modulus, a copper foil adhesion strength, and a dielectric loss were determined.

TABLE 1

|  | The insulation structure of Comparative Example 1 | The insulation structure of Comparative Example 2 | The insulation structure of Comparative Example 3 | The insulation structure of Example |
|---|---|---|---|---|
| Coefficient of thermal expansion (ppm/° C.) | 36 | 40 | 43 | 34 |
| Glass transition temperature (° C.) | 157 | 154 | 152 | 159 |
| Elastic modulus (GPa) | 5.0 | 5.6 | 5.8 | 6.0 |
| Copper foil adhesion strength (gf) | 0.75 | 0.70 | 0.60 | 0.77 |
| Dielectric loss (Df) | 4.9 | 4.1 | 3.3 | 3.2 |

The CTE was measured by raising temperature at a rate of about 10° C./min under a nitrogen atmosphere using a thermomechanical analyzer (TMA)

The glass transition temperature was measured by raising temperature at a rate of about 10° C./min under an air atmosphere using a dynamic mechanical analyzer (DMA).

Young's modulus was measured as the elastic modulus.

The copper foil adhesion strength was measured by using universal testing machine (UTM) after electroplating a copper foil of about 2 μm onto insulation structures of about 18 μm.

The dielectric loss was measured in a range of about 28 GHz using a network analyzer by attaching copper foils to the insulation structures having a dielectric constant of about 0.014 Dk.

Referring to the measured values of the CTE, the glass transition temperature, and the copper foil adhesion strength of the insulation structures of Comparative Examples 1 to 3, it can be seen that the CTE increased and the glass transition temperature and the copper foil adhesion strength decreased as sizes of the fillers decrease. Thus, the CTE, the glass transition temperature, and the copper foil adhesion strength may be deteriorated.

However, it can be seen that the measured value of the CTE of the insulation structure of the Example is smaller than the measured values of the CTE of the insulation structures of Comparative Examples 1 to 3. Further, it can be seen that the measured values of the glass transition temperature and the copper foil adhesion strength of the insulation structure of the Example are greater than the measured values of the glass transition temperature and the copper foil adhesion strength of the insulation structures of Comparative Examples 1 to 3.

Referring to the measured values of the elastic modulus and the dielectric loss of the insulation structures of Comparative Examples 1 to 3, it can be seen that the elastic modulus decreases and the dielectric loss increases as sizes of the fillers increase, and thus the CTE, the elastic modulus and the dielectric loss may be deteriorated.

However, it can be seen that the measured value of the elastic modulus of the insulation structure of the Example is greater than the measured values of the elastic modulus of the insulation structures of Comparative Examples 1 to 3. Further, the measured value of the dielectric loss of the insulation structure of the Example is smaller than the measured values of the dielectric loss of the insulation structures of Comparative Examples 1 to 3.

Accordingly, it can be seen that the CTE, the glass transition temperature, the elastic modulus, the copper foil adhesion strength, and the dielectric loss of the insulation structure of the Example are improved when compared to the insulation structures of Comparative Examples 1 to 3. In obtaining the data for Table 1, the first, second, and third resin layers 10, 12, and 14 of the insulation structure of the Example include the first, second, and third fillers 20, 22, and 24 having different sizes from each other, and the Ra and Rz of the surface of the insulation structure of the Example are about 30 nm and about 100 nm, respectively.

Figure 3:
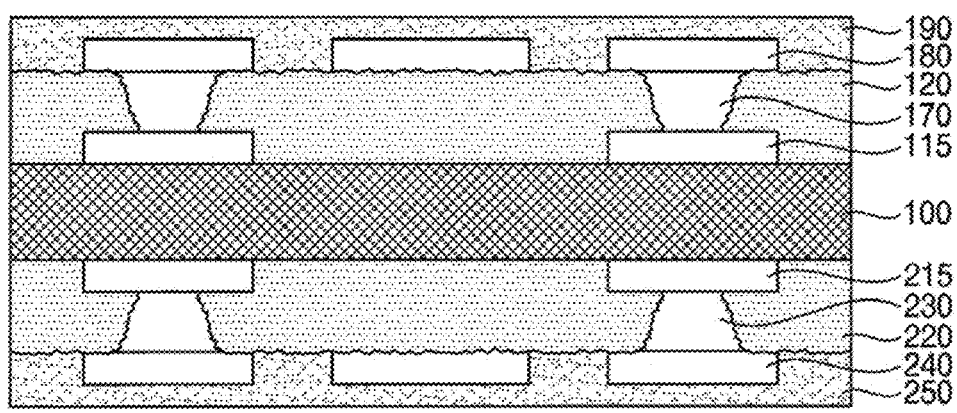
FIG. 3 is a cross-sectional view illustrating a printed circuit board including an insulation structure in accordance with example embodiments.

FIG. 3 is a cross-sectional view illustrating a PCB including an insulation structure in accordance with example embodiments. The PCB may include the insulation structure of which characteristics are described with reference to FIGS. 1 and 2 and Table 1, and thus repeated explanations are omitted herein.

Referring to FIG. 3, the PCB may include a core 100, a first circuit pattern 115 on the core 100, a first insulation structure 120 on the core 100 and covering the first circuit pattern 115, a second circuit pattern 180 on the first insulation structure 120, a first through via 170 penetrating through the first insulation structure 120, a third circuit pattern 215 under the core 100, a second insulation structure 220 under the core 100 and covering the third circuit pattern 215, a fourth circuit pattern 240 under the second insulation structure 220, and a second through via 230 penetrating through the second insulation structure 220. The PCB may further include first and second protective layers 190 and 250.

The core 100 may be a material obtained by impregnating glass, plastic, or sapphire into an insulation structure substantially the same as or similar to the insulation structure shown in FIG. 1, and curing the insulation structure. The core 100 may be a prepreg. The glass may include, e.g., soda lime glass or aluminosilicate glass. The plastic may include, e.g., polyimide (PI), polyethylene terephthalate (PET), propylene glycol (PPG), or polycarbonate (PC). Accordingly, the core 100 may have a low CTE, a high glass transition temperature, a high elastic modulus, a low dielectric loss, and a high interfacial adhesion to the first and third circuit patterns 115 and 215.

The first and second insulation structures 120 and 220 may be a material obtained by curing the insulation structure substantially the same as or similar to the insulation structure shown in FIG. 1.

Accordingly, the first and second insulation structures 120 and 220 may have a low CTE, a high glass transition temperature, a high elastic modulus and a low dielectric loss.

Ra and Rz of an upper surface of the first insulation structure 120 and an inner sidewall on which the first through via 170 is formed may be equal to or less than about 30 nm and equal to or less than about 100 nm, respectively. Thus, the first insulation structure 120 may have a high interfacial adhesion to the second circuit pattern 180 and the first through via 170, so that the second circuit pattern 180 and the first through via 170 may be finely formed on and in the first insulation structure 120, respectively.

Ra and Rz of a lower surface of the second insulation structure 220 and an inner sidewall on which the second through via 230 is formed may be equal to or less than about 30 nm and equal to or less than about 100 nm, respectively. Thus, the second insulation structure 220 may have a high interfacial adhesion to the fourth circuit pattern 240 and the second through via 230, so that fourth circuit pattern 240 and the second through via 230 may be finely formed on and in the second insulation structure 220, respectively.

The first to fourth circuit patterns 115, 180, 215, and 240 may serve as wirings for transferring electrical signals, and may include a metal having a high electrical conductivity, or a paste or a solder paste including the metal. The metal may include gold (Au), silver (Ag), platinum (Pt), titanium (Ti), tin (Sn), copper (Cu), or zinc (Zn). In an example embodiment, the metal may be or include copper (Cu).

The first through via 170 may extend through the first insulation structure 120, and may electrically connect the first circuit pattern 115 and the second circuit pattern 180. The second through via 230 may extend through the second insulation structure 220, and may electrically connect the third circuit pattern 215 and the fourth circuit pattern 240.

The first and second through vias 170 and 230 may include a metal substantially the same as or similar to that of the first to fourth circuit patterns 115, 180, 215 and 240, or a paste or a solder paste including the metal.

In example embodiments, the first through via 170 may extend through the first insulation structure 120 and the core 100, and may electrically connect the second circuit pattern 180 and the third circuit pattern 215. In another implementation, the first through via 170 may extend through the first insulation structure 120, the core 100, and the second insulation structure 220, and may electrically connect the second circuit pattern 180 and the fourth circuit pattern 240.

In example embodiments, the second through via 230 may extend through the second insulation structure 220 and the core 100, and may electrically connect the first circuit pattern 115 and the fourth circuit pattern 240. In another implementation, the second through via 230 may extend through the second insulation structure 220, the core 100, and the first insulation structure 120, and may electrically connect the second circuit pattern 180 and the fourth circuit pattern 240.

The first protective layer 190 may be formed on the first insulation structure 120, and may cover the second circuit pattern 180. The second protective layer 250 may be formed under the second insulation structure 220, and may cover the fourth circuit pattern 240.

The first and second protective layers 190 and 250 may include a solder resist, an oxide, or gold.

The PCB may include the core 100, the first insulation structure 120, and the second insulation structure 220 having low CTE, the glass transition temperature, high elastic modulus, low dielectric loss, and high copper foil adhesion strength, and thus may be in an electrically, mechanically, and thermally stable state.

Figure 7:
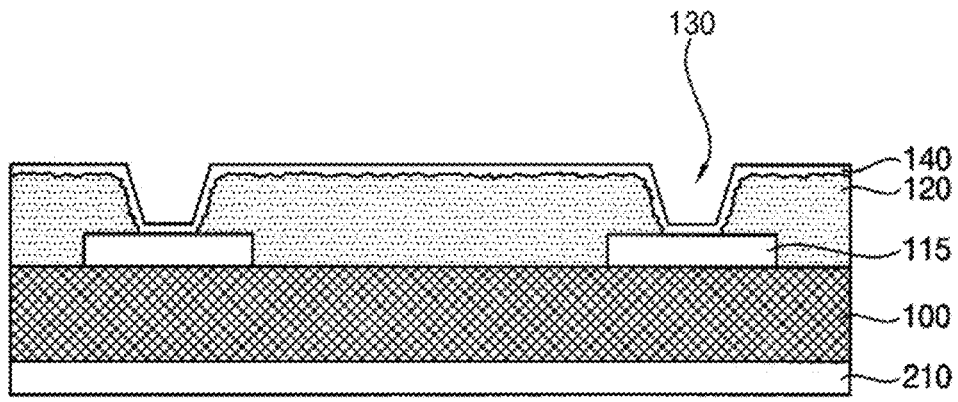
Figure 8:
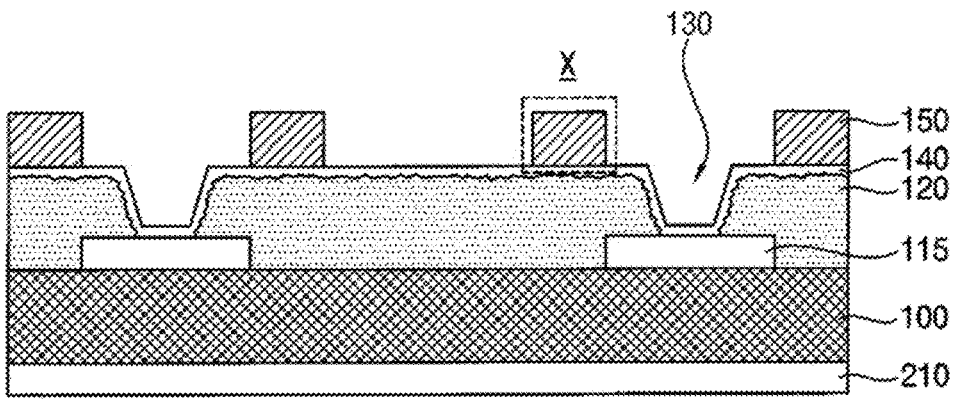
Figure 9:
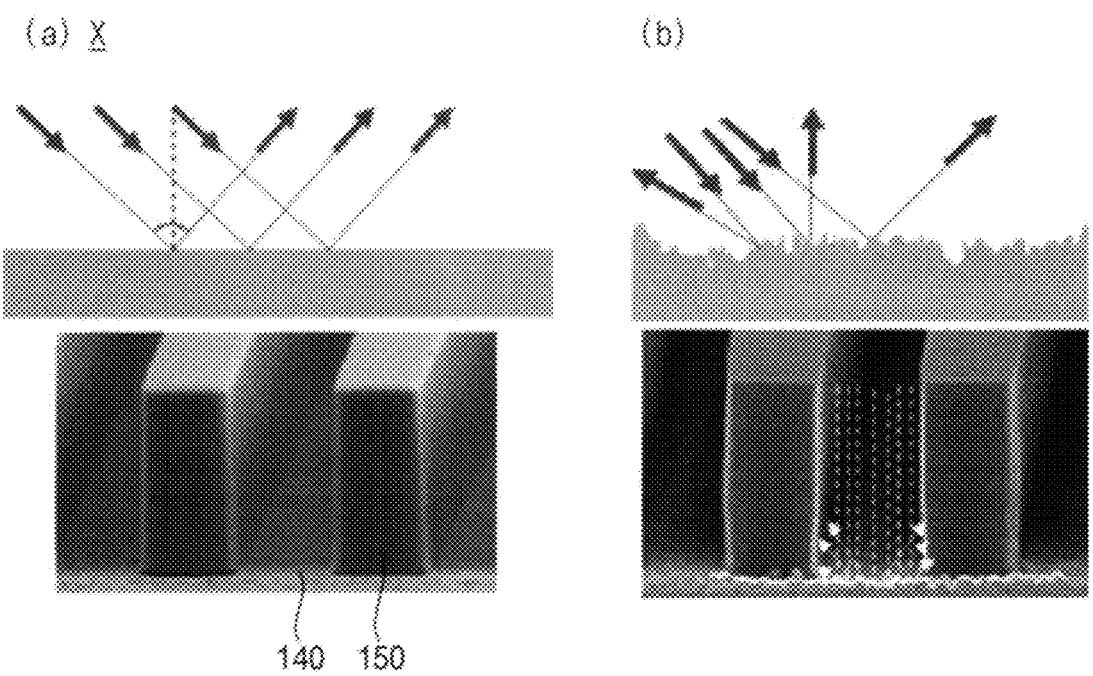

FIGS. 4 to 13 are cross-sectional views illustrating a method of manufacturing a PCB including an insulation structure in accordance with example embodiments. FIG. 9 is scanning electron microscopic (SEM) images of a region X of FIG. 8 and a region in a Comparative Example that may correspond to the region X.

Figure 4:
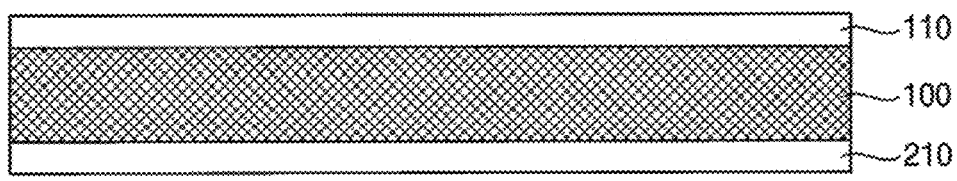
FIGS. 4 to 13 are cross-sectional views illustrating a method of manufacturing a printed circuit board including an insulation structure in accordance with example embodiments.

Referring to FIG. 4, a first metal layer 110 and a second metal layer 210 may be formed on upper and lower surfaces, respectively, of a core 100.

In example embodiments, the first and second metal layers 110 and 210 may be formed by plating a metal on the upper and lower surfaces of the core 100, respectively. The metal may include copper, and thus the core 100, the first metal layer 110, and the second metal layer 210 may form a copper clad laminate (CCL).

Figure 5:
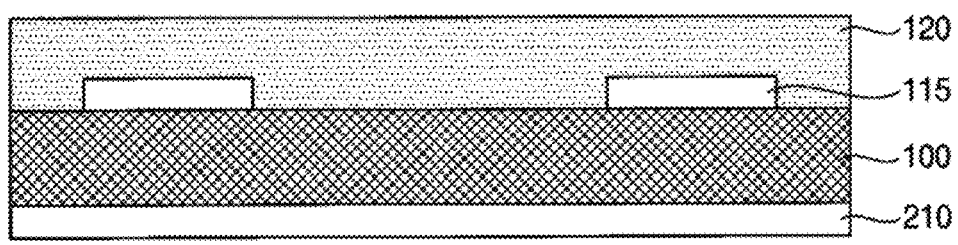

Referring to FIG. 5, the first metal layer 110 may be etched to form a first circuit pattern 115, and a first insulation structure 120 may be formed on the core 100 to cover the first circuit pattern 115.

In example embodiments, the insulation structure 120 may be formed on the core 100 to cover the first circuit pattern 115 by placing the first insulation structure 120 to be in contact with the first circuit pattern 115 and vacuum heat press molding with a vacuum press laminator device or heat press molding with a flat plate press device.

In an example embodiment, the vacuum heat press molding may be performed at a temperature of about 60° C. to about 160° C. and under a pressure of about 0.2 MPa to about 3 MPa.

In an example embodiment, the heat press molding may be performed at a temperature of about 140° C. to about 240° C. and under a pressure of about 1 MPa to about 4 MPa.

Figure 6:
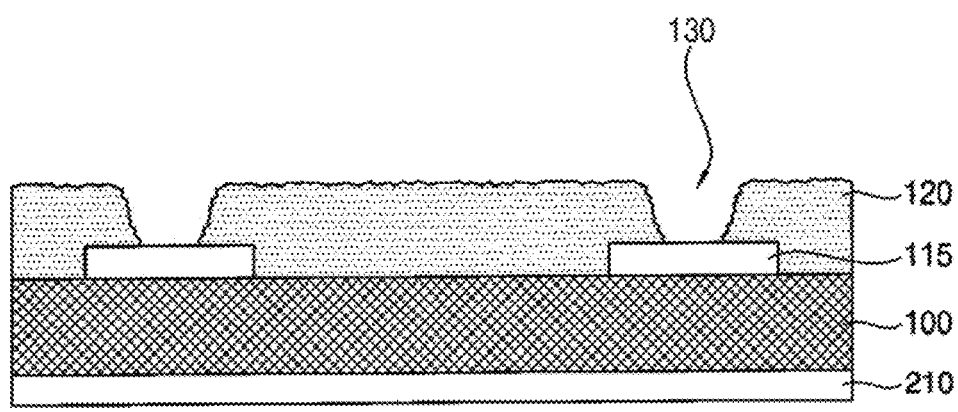

Referring to FIG. 6, a through via hole 130 may be formed through the first insulation structure 120 to expose a portion of an upper surface of the first circuit pattern 115, and a surface and an inner sidewall of the first insulation structure 120 may be roughened, so that the surface and the inner sidewall of the first insulation structure 120 may have a given roughness.

In example embodiments, the through via hole 130 may be formed by a mechanical, laser or chemical processing. The mechanical processing may include milling, drilling, or routing. The laser processing may be performed using excimer, UV, or $CO_2$ laser. The chemical processing may be performed using a mixture including aminosilane and ketones.

In example embodiments, the through via hole 130 may have a width that gradually decreases from a top toward a bottom thereof.

In the process of forming the through via hole 130, smear may be deposited in the through via hole 130, which may be removed by a desmear process. The desmear process may be performed by a chemical treatment using permanganic acid, sulfuric acid, or chromic acid.

Some of the first to third fillers 20, 22, and 24 may be separated from the first insulation structure 120 by the desmear process, so that the surface and the inner sidewall of the first insulation structure 120 may have a given roughness.

Referring to FIG. 7, a seed layer 140 may be formed on the surface and the inner sidewall of the first insulation structure 120.

In example embodiments, the seed layer 140 may be formed by an electroless plating process. Thus, the seed layer 140 may be formed by growing an electroless plating layer on the surface and the inner sidewall of the first insulation structure 120 that has been catalytically treated. The electroless plating layer may be formed using catalyst as an active point. Generally, an electroless plating layer may have low adhesion to the first insulation structure 120. However, according to an example embodiment, Ra and Rz of the surface of the first insulation structure 120 and an inner sidewall of a third resin layer 14 included in the first insulation structure 120 may be about equal to or less than about 30 nm and equal to or less than about 100 nm, respectively, Ra and Rz of an inner sidewall of a first resin layer 10 included in the first insulation structure 120 may be about 50 nm to about 70 nm and about 700 nm to about 900 nm, respectively, and Ra and Rz of an inner sidewall of a second resin layer 12 included in the first insulation structure 120 may be about 40 nm to about 50 nm and about 500 nm to about 700 nm, respectively, and thus the electroless plating layer may have adhesion to the first insulation structure 120, so that the seed layer 140 may have a high interfacial adhesion to the first insulation structure 120.

In example embodiments, the seed layer 140 may include copper, and a thickness of the seed layer 140 may be about 5 μm or less.

Referring to FIG. 8, a photoresist pattern 150 may be formed on the seed layer 140.

The photoresist pattern 150 may be formed by applying a photoresist (not shown) on the seed layer 140, and patterning the photoresist through exposure and development processes.

In example embodiments, the photoresist may be a dry film or a liquid photoresist.

In example embodiments, a light source used in the exposure process may be ultraviolet (UV), e.g., UV light having a wavelength of about 365 nm.

Referring to FIG. 9, SEM images of the seed layer 140 and the photoresist pattern 150 of an Example and a seed layer and a photoresist pattern of a Comparative Example are shown.

Specifically, (a) in FIG. 9 is a SEM image of the seed layer 140 and the photoresist pattern 150 in a region X of FIG. 8, and (b) in FIG. 9 is a SEM image of the seed layer and the photoresist pattern of a Comparative Example.

Referring to FIG. 9, in (a), the Ra and Rz of the first insulation structure 120 may be small values of equal to or less than about 30 nm and equal to or less than about 100 nm, respectively, and the seed layer 140 may have a high interfacial adhesion to the first insulation structure 120. Thus, the seed layer 140 may also have Ra and Rz substantially the same as or similar to those of the first insulation structure 120. Accordingly, the seed layer 140 may have uniform and low roughness, and an incident angle and a reflection angle of UV are substantially the same during the exposure process, so that UV scattering may decrease, and thus the photoresist pattern 150 may be finely formed.

In FIG. 9, (b) is a SEM image of the seed layer and the photoresist pattern of a Comparative Example. The PCB in the Comparative Example includes an insulation structure containing a resin having fillers of a diameter of about 500 nm, and a volume ratio of the fillers to the resin is about 40%.

The Ra and Rz of the insulation structure of the Comparative Example may be high values of about 70 nm and about 900 nm, respectively, and thus the seed layer may have a low interfacial adhesion to the insulation structure. Thus, Ra and Rz of the seed layer may be higher than those of the insulation structure. Accordingly, the seed layer may have a non-uniform and high roughness, and an incident angle and a reflection angle of UV are not the same during the exposure process, so that UV scattering may increase, and thus the photoresist pattern may not be finely formed.

Referring to the Comparative Example in (b) of FIG. 9, if the surface roughness of the insulation structure high, the seed layer may be formed unevenly without being completely adhered to the insulation structure. A non-uniform photoresist pattern may be formed by the non-uniform seed layer, and as a result, a circuit pattern may not be finely formed.

On the other hand, the first insulation structure 120 in accordance with the Example in (a) of FIG. 9 may have a low roughness, and the seed layer 140 may be sufficiently adhered to the first insulation structure 120, so that the seed layer 140 may be uniformly formed. Accordingly, the photoresist pattern 150 may be uniformly formed by the uniform seed layer 140, and the second circuit pattern 180 may be finely formed.

Figure 10:
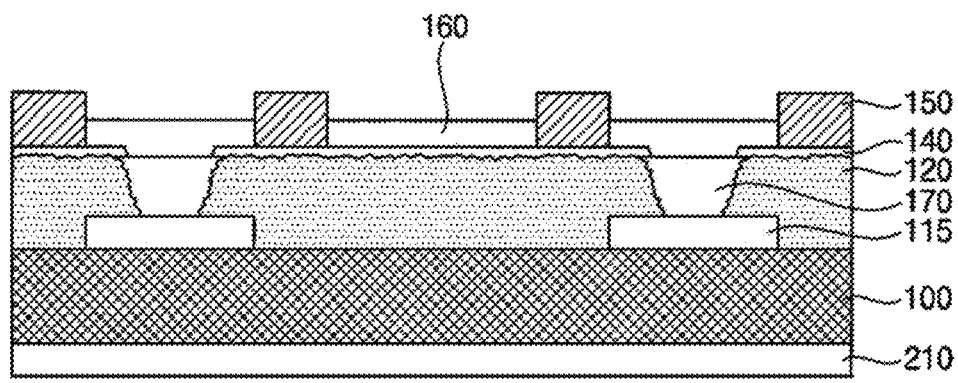

Referring to FIG. 10, a first through via 170 and a plating layer 160 may be formed on the seed layer 140.

The first through via 170 may be formed to fill the through via hole 130, and the plating layer 160 may be formed on the first through via 170 and the seed layer 140. The first through via 170 and the plating layer 160 may be merged with respective portions of the seed layer 140 thereunder.

In example embodiments, the first through via 170 and the plating layer 160 may be formed by electroless plating, electroplating, screen printing, sputtering, evaporation, ink jetting, or dispensing.

In an example embodiment, a plating solution used for the electroless plating may include a copper ion ($Cu^{2+}$) source, a pH adjusting agent, a reducing agent, and a complex forming agent. The copper ion source may include $CuSO_4 \cdot 5H_2O$ or $CuSO_4$, the pH adjusting agent may include KOH or NaOH, the reducing agent may include formaldehyde (HCHO), and the complex forming agent may include ethylenediamine tetraacetic acid (EDTA) or a surfactant. The electroless plating may be performed by reducing copper with the reducing agent according to the following reaction equation.

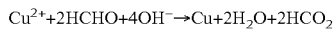

$$Cu^{2+}+2HCHO+4OH^- \rightarrow Cu+2H_2O+2HCO_2$$

In an example embodiment, a plating solution used for the electrolytic plating (electroplating) may include a copper ion source, sulfuric acid ($H_2SO_4$) controlling an electrical conductivity, and hydrochloric acid (HCl) controlling a reduction reaction. The electrolytic plating may be performed by putting the copper ion source in sulfuric acid ($CuSO_4$) and water ($H_2O$) to be decomposed into $Cu^{2+}$ and $SO_4^{2-}$, and connecting a cathode to the seed layer 140.

Figure 11:
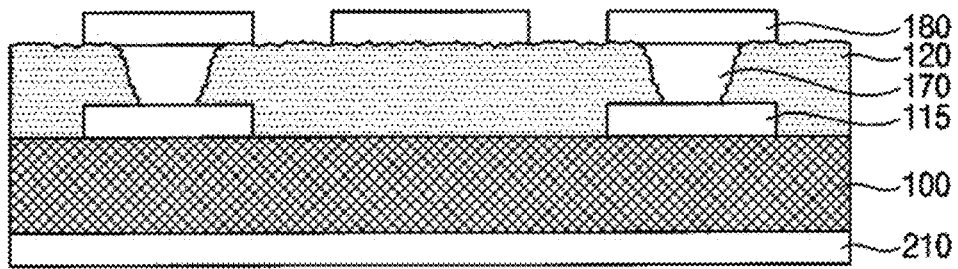

Referring to FIG. 11, after removing the photoresist pattern 150, the exposed seed layer 140 may be etched to form a second circuit pattern 180.

In example embodiments, the etching process may be performed by a flash etching process in order to selectively remove only the micro-sized seed layer 140. Thus, the flash etching process may be performed by forming an etching resist pattern on the seed layer 140 and the plating layer 160 and then removing only the seed layer 140 by a difference in an etching reaction rate depending on a height difference between the seed layer 140 and the plating layer 160. The etching resist pattern may be peeled off from the plating layer 160 to form the second circuit pattern 180. A solution used in the flash etching process may include, e.g., about 7.3 w/v % to about 7.7 w/v % of hydrogen peroxide ($H_2O_2$) and about 2.8 w/v % to about 3.2 w/v % of an organic acid.

Figure 12:
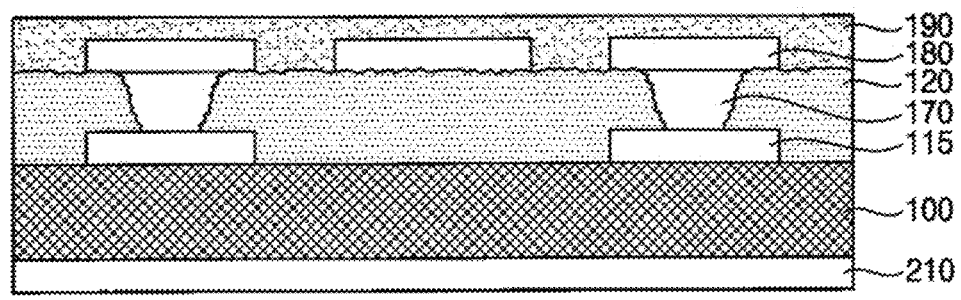

Referring to FIG. 12, a first protective layer 190 may be formed on the first insulation structure 120 to cover the second circuit pattern 180.

Figure 13:
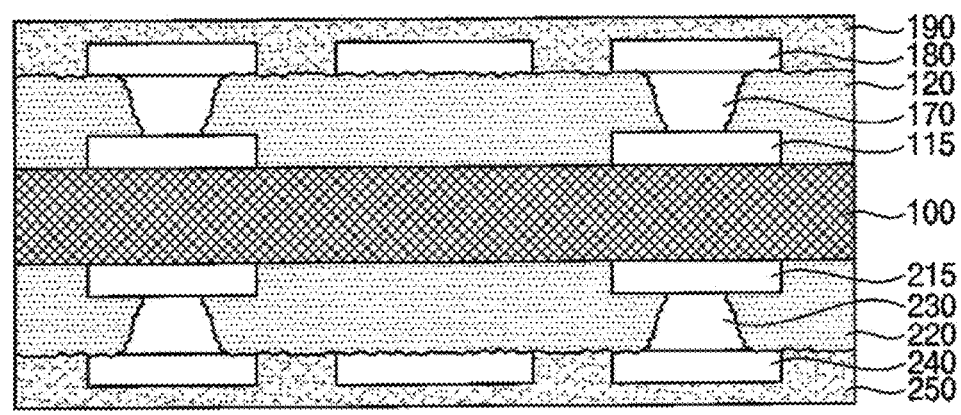

Referring to FIG. 13, a third circuit pattern 215, a second insulation structure 220, a second through via 230, a fourth circuit pattern 240, and a second protective layer 250 may be sequentially formed under the core 100 by performing substantially the same processes as the processes described with reference to FIGS. 5 to 12.

In example embodiments, the third circuit pattern 215, the second insulation structure 220, the second through via 230, the fourth circuit pattern 240, and the second protective layer 250 may be formed before or simultaneously with the processes described with reference to FIGS. 5 to 12.

The fabrication of the PCB may be completed by performing the above described processes.

By way of summation and review, in a process of forming a fine circuit pattern, a uniform fine circuit pattern may not be formed due to a low interfacial adhesion between a photoresist and an insulation structure. An insulation structure having a low surface roughness may thus be used.

As described above, embodiments may provide an insulation structure having improved properties. Embodiments may provide a PCB including an insulation structure having improved properties.

An insulation structure in accordance with example embodiments may include nano-sized fillers, so that a surface of the insulation structure may have a low roughness after a desmear treatment. Accordingly, an interfacial adhesion with a photoresist formed on the insulation structure may increase. Thus, a fine circuit pattern may be easily formed due to reduction of UV scattering during an exposure process. In addition, the insulation structure may include fillers of different sizes, thereby having a low coefficient of thermal expansion (CTE), a high glass transition temperature (Tg), a high elastic modulus, low dielectric loss, and a high copper foil adhesion strength.

Accordingly, a printed circuit board including the insulation structure may maintain an electrically, mechanically, and thermally stable state.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An insulation structure, comprising:
a first resin layer including first fillers;
a second resin layer on the first resin layer and including second fillers; and
a third resin layer on the second resin layer and including third fillers,
wherein:
a diameter of each of the first fillers is more than about 200 nm and equal to or less than about 500 nm,
a diameter of each of the second fillers is more than about 10 nm and equal to or less than about 200 nm,
a diameter of each of the third fillers is equal to or less than about 10 nm, and
an arithmetic average roughness (Ra) and a ten point average roughness (Rz) of a surface of the insulation structure is equal to or less than about 30 nm and equal to or less than about 100 nm, respectively.

2. The insulation structure as claimed in claim 1, wherein:
a thickness of the first resin layer is greater than a thickness of the second resin layer,
a thickness of the second resin layer is greater than a thickness of the third resin layer, and
a total thickness of the first to third resin layers is about 15 μm to about 40 μm.

3. The insulation structure as claimed in claim 2, wherein:
the thickness of the first resin layer is equal to or more than about 10 μm and equal to or less than about 25 μm,
the thickness of the second resin layer is equal to or more than about 5 μm and less than about 10 μm, and
the thickness of the third resin layer is less than about 5 μm.

4. The insulation structure as claimed in claim 1, wherein each of a volume ratio of the first fillers to the first resin layer, a volume ratio of the second fillers to the second resin layer, and a volume ratio of the third fillers to the third resin layer is about 40% to about 80%.

5. The insulation structure as claimed in claim 4, wherein each of the volume ratio of the first fillers to the first resin layer, the volume ratio of the second fillers to the second resin layer, and the volume ratio of the third fillers to the third resin layer is about 40%.

6. The insulation structure as claimed in claim 1, wherein each of the first to third resin layers includes an epoxy resin.

7. The insulation structure as claimed in claim 6, wherein the epoxy resin includes a bisphenol A epoxy resin, a phenol novolac epoxy resin, a cresol novolac epoxy resin, a naphthalene-based epoxy resin, a rubber-modified epoxy resin, or a phosphorus-based epoxy resin.

8. The insulation structure as claimed in claim 1, wherein each of the first to third fillers includes silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, or calcium zirconate.

9. The insulation structure as claimed in claim 1, wherein each of the first to third resin layers further includes a curing agent.

10. The insulation structure as claimed in claim 1, wherein each of the first to third resin layers further includes a curing accelerator.

11. The insulation structure as claimed in claim 1, wherein each of the first to third resin layers further includes a thermoplastic resin.

12. An insulation structure, comprising:
first to third resin layers sequentially stacked, the first to third resin layers including first to third fillers, respectively, wherein:
the first filler has a greater diameter than the second filler, and the second filler has a greater diameter than the third filler,
the first resin layer has a greater thickness than the second resin layer, and the second resin layer has a greater thickness than the third resin layer,
the diameter of the third filler is equal to or less than about 5% of the diameter of the first filler, and an arithmetic average roughness (Ra) and a ten point average roughness (Rz) of a surface of the third resin layer is equal to or less than about 30 nm and equal to or less than about 100 nm or less, respectively.

13. The insulation structure as claimed in claim 12, wherein a total thickness of the first to third resin layers is about 15 μm to about 40 μm.

14. The insulation structure as claimed in claim 13, wherein:
   a thickness of the first resin layer is equal to or more than about 10 μm and equal to or less than about 25 μm,
   a thickness of the second resin layer is equal to or more than about 5 μm and less than about 10 μm, and
   a thickness of the third resin layer is less than about 5 μm.

15. The insulation structure as claimed in claim 12, wherein each of a volume ratio of the first fillers to the first resin layer, a volume ratio of the second fillers to the second resin layer, and a volume ratio of the third fillers to the third resin layer is about 40% to about 80%.

16. A printed circuit board (PCB), comprising:
   a core;
   a first circuit pattern on the core;
   a first insulation structure on the core and covering the first circuit pattern; and
   a second circuit pattern on the first insulation structure, wherein:
   the first insulation structure includes:
      a first resin layer including first fillers;
      a second resin layer on the first resin layer and including second fillers; and
      a third resin layer on the second resin layer and including third fillers,
      wherein a diameter of each of the first fillers is more than about 200 nm and equal to or less than about 500 nm, a diameter of each of the second fillers is more than about 10 nm and equal to or less than about 200 nm, and a diameter of each of the third fillers is equal to or less than about 10 nm, and
   an arithmetic average roughness (Ra) and a ten point average roughness (Rz) of a surface of the first insulation structure is equal to or less than about 30 nm and equal to or less than about 100 nm, respectively.

17. The PCB as claimed in claim 16, further comprising:
   a third circuit pattern under the core;
   a second insulation structure under the core and covering the third circuit pattern; and
   a fourth circuit pattern under the second insulation structure,
   wherein the second insulation structure includes the same material as the first insulation structure.

18. The PCB as claimed in claim 16, further comprising a through via extending through the first insulation structure and electrically connecting the first circuit pattern and the second circuit pattern.

19. The PCB as claimed in claim 16, wherein:
   a thickness of the first resin layer is equal to or more than about 10 μm and equal to or less than about 25 μm,
   a thickness of the second resin layer is equal to or more than about 5 μm and less than about 10 μm, and
   a thickness of the third resin layer is less than about 5 μm.

20. The PCB as claimed in claim 16, wherein each of a volume ratio of the first fillers to the first resin layer, a volume ratio of the second fillers to the second resin layer, and a volume ratio of the third fillers to the third resin layer is about 40% to about 80%.

* * * * *